United States Patent
Mahaffey et al.

(10) Patent No.: US 10,045,451 B1
(45) Date of Patent: Aug. 7, 2018

(54) LIGHTING CONTROL SYSTEM, EXPANSION PACK, AND METHOD OF USE

(71) Applicant: Universal Lighting Technologies, Inc., Madison, AL (US)

(72) Inventors: Rob Mahaffey, Burnaby (CA); John Cavacuiti, Burnaby (CA); John Hung, Burnaby (CA); Audey Korpus, Burnaby (CA); Tony Lee, Burnaby (CA); Tan Ly, Burnaby (CA); Kaveh Malakuti, Burnaby (CA)

(73) Assignee: Universal Lighting Technologies, Madison, AL (US)

( * ) Notice: Subject to any disclaimer, the term of this patent is extended or adjusted under 35 U.S.C. 154(b) by 56 days.

(21) Appl. No.: 14/849,282

(22) Filed: Sep. 9, 2015

Related U.S. Application Data

(60) Provisional application No. 62/047,955, filed on Sep. 9, 2014.

(51) Int. Cl.
  *H05B 37/02* (2006.01)
  *H05K 5/02* (2006.01)

(52) U.S. Cl.
  CPC ................... *H05K 5/0256* (2013.01)

(58) Field of Classification Search
  CPC .................................... H05K 5/0256
  USPC ........................................... 361/729
  See application file for complete search history.

(56) References Cited

U.S. PATENT DOCUMENTS

| | | | | |
|---|---|---|---|---|
| 7,844,367 B2* | 11/2010 | Nickerson | ............... | A01G 25/16 137/624.11 |
| 2008/0136334 A1* | 6/2008 | Robinson | ............ | H05B 37/0254 315/151 |
| 2010/0280677 A1* | 11/2010 | Budike, Jr. | ........ | H05B 37/0272 700/296 |
| 2010/0301772 A1* | 12/2010 | Hahnlen | ............ | H05B 37/0209 315/297 |
| 2011/0133668 A1* | 6/2011 | Rix | ..................... | H05B 37/0245 315/294 |
| 2011/0234117 A1* | 9/2011 | Knapp | ............... | H05B 33/0809 315/291 |
| 2013/0076270 A1* | 3/2013 | Alexandrovich | .. | H05B 37/0254 315/362 |

* cited by examiner

*Primary Examiner* — Tuan T Dinh
*Assistant Examiner* — Rockshana Chowdhury
(74) *Attorney, Agent, or Firm* — Patterson Intellectual Property Law, P.C.; Gary L. Montle; Grant M. Ford

(57) ABSTRACT

A lighting control system may include a main lighting controller having an opening therein and a main coupler for connecting to an expansion pack. An expansion pack of the lighting control system may have a connector having an opening therein and an expansion coupler for connecting to the main lighting controller. Junction boxes may be configured to connect to the main lighting controller and expansion pack based on a predetermined distance associated with openings of the main lighting controller and expansion pack. Installation of a combined main lighting controller and expansion pack at a plurality of junction boxes may be coordinated. A method may include combining a main lighting controller and an expansion pack, connecting two or more junction boxes to one another to form an array, and connecting the two or more junction boxes to the main lighting controller and expansion pack in accordance with a predetermined spacing.

19 Claims, 6 Drawing Sheets

LIGHTING CONTROL SYSTEM, EXPANSION PACK, AND METHOD OF USE

CROSS-REFERENCES TO RELATED APPLICATIONS

This application claims benefit of U.S. Provisional Patent Application No. 62/047,955, filed Sep. 9, 2014, and which is hereby incorporated by reference in its entirety.

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

STATEMENT REGARDING FEDERALLY SPONSORED RESEARCH OR DEVELOPMENT

Not Applicable

REFERENCE TO SEQUENCE LISTING OR COMPUTER PROGRAM LISTING APPENDIX

Not Applicable

BACKGROUND OF THE INVENTION

The present invention relates generally to a modular lighting control system, an expansion pack, and a method of coordinating installation of a combined main lighting controller and expansion pack at a plurality of junction boxes.

Conventional lighting control systems may require a time consuming and costly rough-in process. Various control system configurations may be necessary based on local rules or law, industry practice, or given standards. For example, Title 24 of California's Code of Regulations requires receptacle control, and some applications such as classrooms require emergency lighting. Thus, an increased number of electrical relays may be required for particular applications, possibly more than are provided in an existing lighting controller.

Each installation configuration may be different, and thus distinct physical and electrical requirements may be associated with a given installation. A rough-in process may be used during construction or installation to permit pre-wiring or configuration of electrical components associated with a lighting control system. For example, a contractor may perform rough-in by pre-wiring a lighting control system before installing a control device. Each installation may have distinct electrical functionality requirements.

Current control systems fail to provide control device modularity while also reducing an amount of labor required for installation. In one example, a plurality of devices may together provide electrical functionality. However, each of the plurality of devices is required to be wired separately, including individual wiring vis-à-vis junction boxes, and thus an amount of labor required for installation is significantly increased. A separate implementation may incorporate all functionality into a single device. However, the device is not configurable, and follows a one-size-fits-all model, thereby increasing cost.

A need exists for a device which balances an all-in-one approach and a purely modular approach. The device would permit an optimal control solution in terms of its feature set, while easing installation burden. The device may include a main lighting controller and at least one expansion pack, designed to provide expanded electrical functionality to satisfy the requirements of a particular installation. At time of rough-in, a contractor may be provided with a number of junction boxes for a particular installation and may install the junction boxes in a manner consistent with a control device configuration associated with a combined main lighting controller and expansion pack.

BRIEF SUMMARY OF THE INVENTION

One embodiment of the present invention provides a lighting control system having a main lighting controller which includes at least one electrical relay, a main connector having an opening configured to permit access to an interior portion of the main lighting controller, and a main coupler configured to connect to an expansion pack. The expansion pack of the lighting control system may include at least one electrical relay, an expansion connector having an opening configured to permit access to an interior portion of the expansion pack, and an expansion coupler configured to connect to the main lighting controller. The lighting control system may further have at least two junction boxes, each including at least one configurable opening adapted to permit access to an interior portion of the junction box. The junction boxes are capable of connecting to the main lighting controller and expansion pack. A location of the main connector and a location of the expansion connector may form a predetermined distance therebetween when the main lighting controller and expansion pack are connected via the main coupler and the expansion coupler. The configurable opening of each of the two junction boxes may correspond to the predetermined distance.

Another embodiment of the present invention provides an expansion pack configured to connect to a main lighting controller and a junction box of a lighting control system. The expansion pack may include at least one electrical relay, an expansion connector having an opening configured to permit access to an interior portion of the expansion pack, and an expansion coupler configured to connect to the main lighting controller. A location of the expansion connector may form a predetermined distance from a main connector of the main lighting controller when the expansion pack is connected to the main lighting controller. The expansion pack may connect to the junction box while connected to the main lighting controller, in accordance with the predetermined distance.

A further embodiment of the present invention provides a method for coordinating installation of a combined main lighting controller and expansion pack at a plurality of junction boxes. The method may include determining a required number of electrical components corresponding to a particular installation, combining a main lighting controller and an expansion pack to satisfy the required number, determining a required quantity of junction boxes corresponding to the particular installation, connecting two or more junction boxes to one another to form an array, determining a spacing between the two or more junction boxes such that at least one knockout associated with each of the two or more junction boxes corresponds to an opening associated with the main lighting controller and the expansion pack, and connecting the two or more junction boxes to the main lighting controller and expansion pack in accordance with the determined spacing.

Numerous other objects, features, and advantages of the present invention will be readily apparent to those skilled in

DETAILED DESCRIPTION OF THE INVENTION

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

Figure 1:
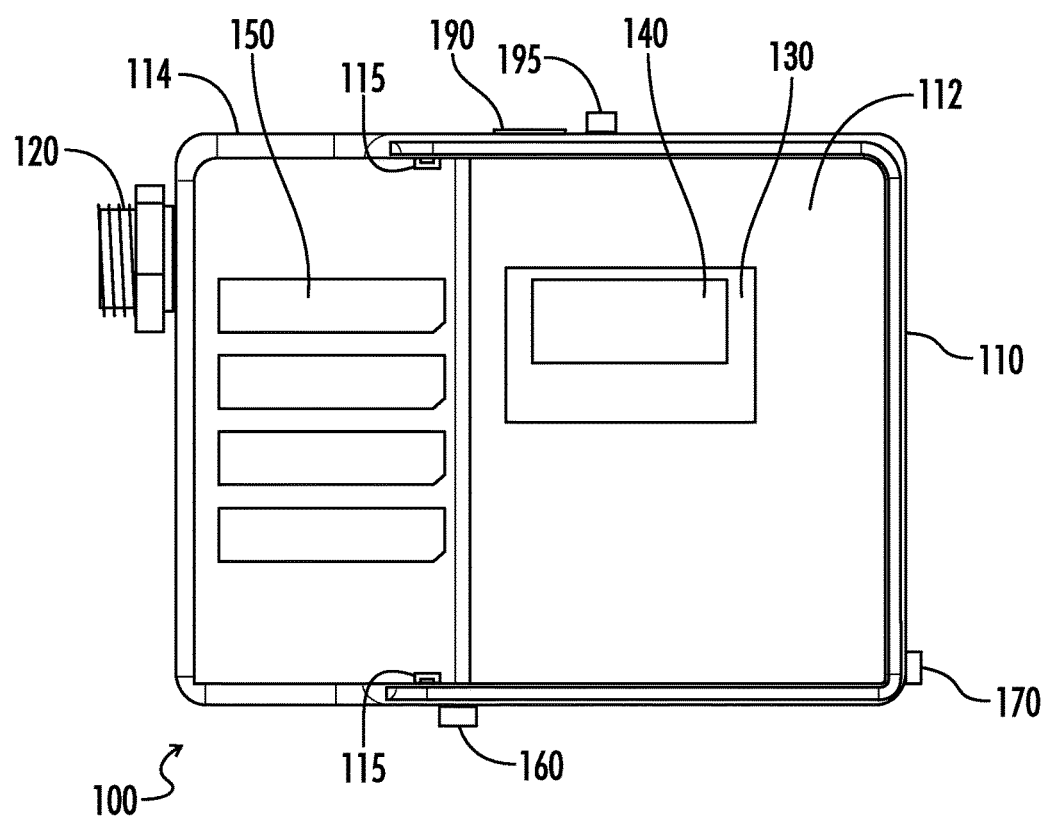
FIG. 1 is a front view of a main controller according to an exemplary embodiment.
Figure 2:
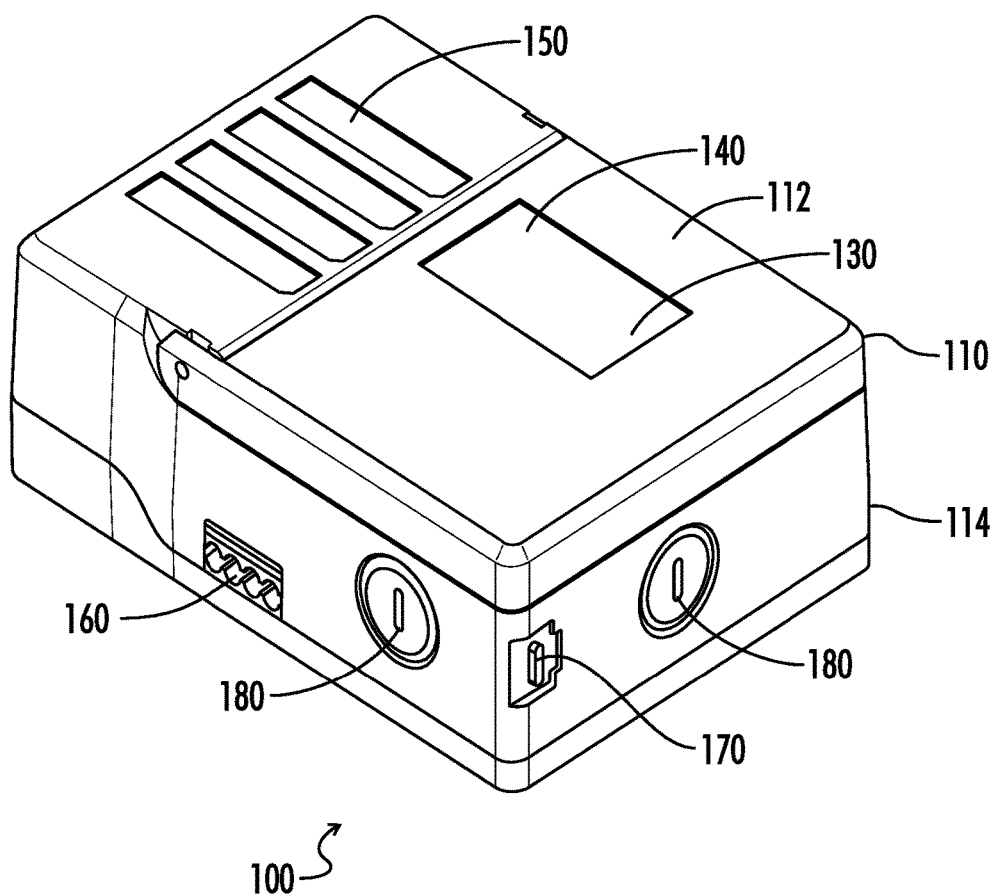
FIG. 2 is an elevated perspective view of a main controller according to an exemplary embodiment.

Referring generally to FIGS. 1 and 2, a main controller according to the present invention are now illustrated in greater detail. Where the various figures may describe embodiments sharing various common elements and features with other embodiments, similar elements and features are given the same reference numerals and redundant description thereof may be omitted below.

Various embodiments of a main controller according to the present invention may be designed in order to connect with, for example, an expansion pack configured to permit application variance and rough-in. Embodiments of a main controller may further be designed such that the main controller is connected to an expansion pack to form a modular lighting control apparatus.

In one exemplary embodiment illustrated, for example at FIGS. 1-2, a main controller 100 may include a body 110 having an outer portion 112 and a frame 114. In one exemplary embodiment, the outer portion 112 may be connected to the frame 114, for example, by means of one or more hinges 115 as illustrated in FIGS. 1-2. In one exemplary embodiment, the outer portion 112 may be configured to permit access to a cavity within the main controller 100. Although described and illustrated in the present invention as having one or more hinges 115, a connection between the outer portion 112 and frame 114 may be implemented by any fastener or connector which permits access to a cavity within the main controller 100.

The outer portion 112 and frame 114 may include a plurality of materials without departing from the spirit and scope of the present invention. For example, the outer portion 112 and frame 114 may be formed of a plastic, metal, or any other material capable, either alone or in combination, of providing sufficient rigidity for use as a housing. In one embodiment, an insulating material (e.g., rubber, ceramic, polymers, or the like) may be used to form the outer portion 112 and frame 114, or an insulating material layer may be implemented at an interior, exterior, or both interior and exterior surface areas of the outer portion 112 and frame 114.

Figure 5:
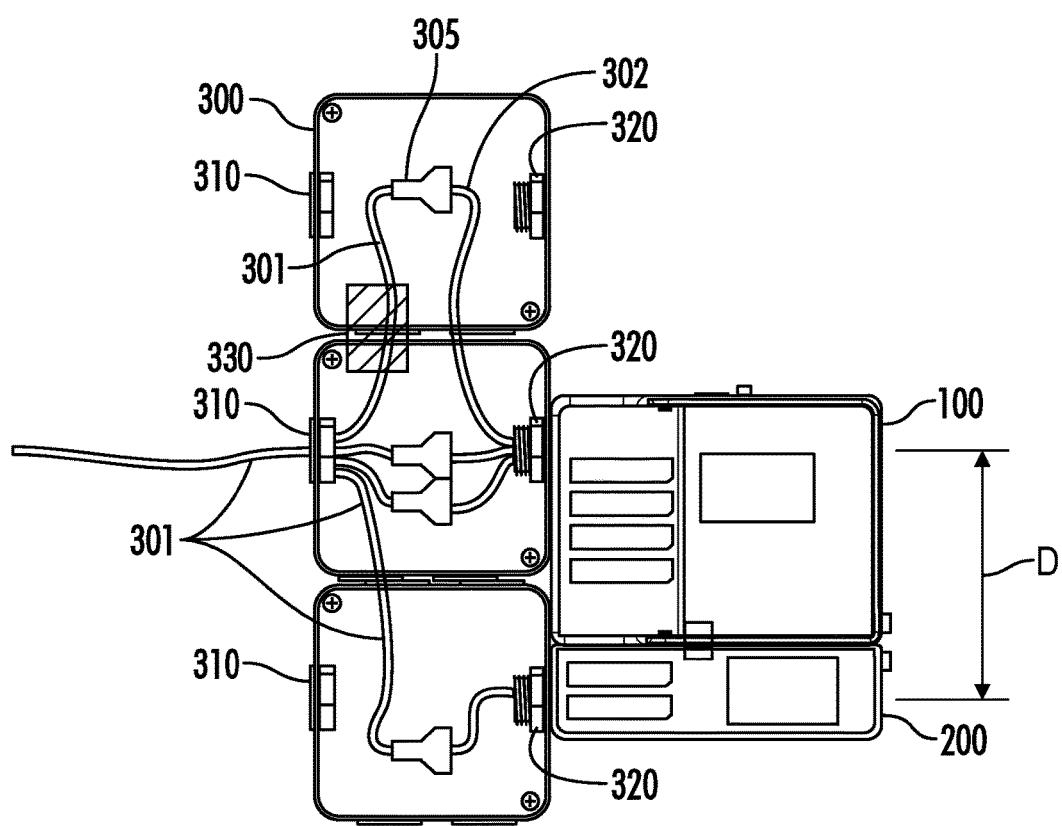
FIG. 5 is a front view of a controller as illustrated by FIG. 4 provided in an exemplary configuration having three junction boxes according to an exemplary embodiment.

A main connector 120 may be located at an exterior portion of the body 110 in one embodiment. For example, the main connector 120 may be located at an exterior portion of frame 114 as illustrated in FIGS. 1-2. The main connector 120 may be configured to permit access to an interior cavity of main controller 100. In one exemplary embodiment, the main connector 120 may include a chase nipple (e.g., a ½ inch chase nipple) configured to permit at least one wire to pass into a cavity of the main controller 100. Main connector 120 may be configured to receive an input associated with at least one relay. The main connector 120 may be configured to connect to at least one junction box 300 (e.g., as illustrated at FIG. 5). When connected to a junction box 300, the main connector 120 may be configured to permit at least one input from a junction box 300 to pass into a cavity of the main connector 100.

The main controller 100 may further include at least one information section 150. In one embodiment, an information section 150 may be provided to convey information corresponding to at least one electrical or physical configuration associated with the main controller 100. For example, in one embodiment an information section 150 may include a connection identifier associated with a lighting controller. However, other uses may exist for information conveyed by an information section 150 within the scope of the present invention.

In one embodiment, the outer portion 112 may include a design area 130. The design area 130 may be provided at an exterior surface of the outer portion 112. The design area 130 may be used, for example, to convey information and/or content. In one exemplary embodiment, the design area 130 may form a recessed area into an outer surface of the outer portion 112, or may include an extruded section extending outwardly from the outer surface of the outer portion 112. The design area 130 may optionally include at least one design 140. For example, the design 140 may include a logo, a graphic, text, or any other data or information intended to be conveyed.

The main controller 100 may include at least one electronic coupler 160. The electronic coupler 160 may be used to form an electrical connection and/or control connection between the main controller 100 and at least one expansion pack 200. The electronic coupler 160 may include any material or connector capable of forming an electrical connection between the main controller 100 and expansion pack 200. For example, the electronic coupler 160 may include a Universal Serial Bus (USB) connector or socket, a copper wire connector or socket (e.g., a RJ-12 or RJ-45 connector), a metallic contact, etc., within the scope of the present invention.

In addition or alternative to electronic coupler 160, the main controller 100 may include an expansion coupler 170. Expansion coupler 170 may in one embodiment provide a physical coupling mechanism for connecting a main controller 100 and at least one expansion pack 200. In one embodiment, the expansion coupler 170 may include a latch mechanism (e.g., as illustrated by FIG. 2), a hook-and-loop mechanism, a key and lock mechanism, or any other physical connection means which permits a physical attachment between a main controller 100 and an expansion pack 200. In one exemplary embodiment, the expansion coupler 170 may enable a main controller 100 to easily connect to at least one expansion pack 200, for example, by snapping together with an expansion coupler 170 described herein.

The main controller 100 may include at least one knockout 180. Each knockout 180 may be configured to permit an opening to be formed in the body 110 of main controller 100 to permit access to a cavity formed within the main controller 100. For example, in one exemplary embodiment at least one knockout 180 may be removed from the main controller 100 to permit various physical and/or electrical connections to be formed between the main controller 100 and an external entity.

In one embodiment, the main controller 100 may include at least one transceiver 190 at an external surface thereof. The transceiver 190 may include, for example, an RJ-45 port, a serial port, a wireless communication port, or any other port capable of transmitting and/or receiving information from an external source. The transceiver 190 may be used to transmit and/or receive information using one or more protocols such as BACnet, Lonworks®, MODBUS®, KNX®, DALI®, TCP/IP, or any other protocol without departing from the spirit and scope of the present invention. In one embodiment, the transceiver 190 may connect to a BACnet network for sending and receiving operational and/or command-based information. For example, the main controller 100 may be configured to transmit operational data using the transceiver 190 and/or receive command data at the transceiver 190.

The main controller 100 may further include an indicator 195. Indicator 195 may include a means of conveying visual information to a user corresponding to an operational state of the main controller 100. For example, the indicator 195 may include a light source, such as a light emitting diode (LED) intended to convey an operational state of the main controller 100 to a user. The indicator 195 may convey information to a user in a plurality of modes, including status-based illumination, changes in color, blinking at a predetermined or corresponding rate or number of times, or any other manner of conveying status to a user.

In one exemplary implementation, a single main controller 100 may be insufficient for a particular installation. For example, a main controller 100 may be configured to control four external loads, whereas a controlled area may include more than four external loads to be controlled. Furthermore, particular industry organization, local rules or law, or a general desire may mandate physically separate control associated with, for example, emergency lighting. In such an installation, one or more expansion packs 200 may be configured to connect with one or more main controllers 100 to satisfy a particular need.

Figure 3:
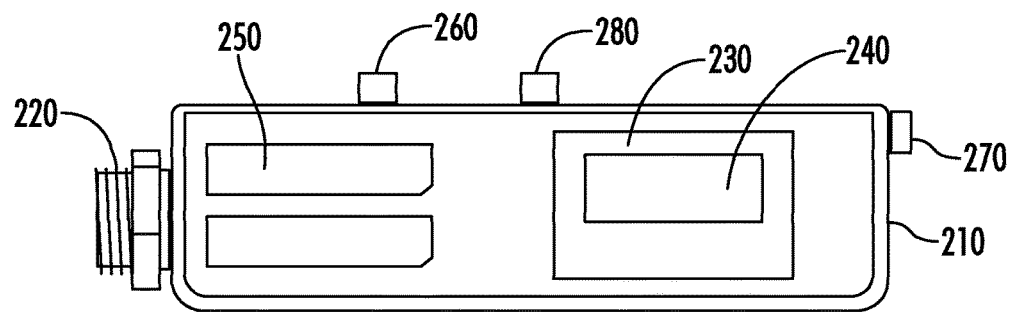
FIG. 3 is a front view of an expansion pack according to an exemplary embodiment.

As illustrated at FIG. 3, an expansion pack 200 may include a body 210 having an expansion connector 220, a design area 230, at least one design 240, a connection listing 250, an electronic coupler 260, and an expansion coupler 270. While FIG. 3 is illustrated as including each of the above-noted features, each of the features may be optional based upon a specific implementation or design, and the expansion pack 200 may include one or more of any of the above-noted features in combination with one another.

The body 210 of expansion pack 200 may be formed of a number of materials without departing from the spirit and scope of the present invention. For example, the body 210 may be formed of plastics, metal, or any other material capable of providing sufficient rigidity for use as an electrical housing. In one embodiment, an insulating material (e.g., rubber, ceramic, polymers, or the like) may be used to form the body 210, or an insulating material layer may be implemented at an interior, exterior, or both interior and exterior surface areas of the body 210.

The expansion pack 200 may include an expansion connector 220 similar to the main connector 120 described above with reference to main controller 100. The expansion connector 220 may be located at an exterior portion of the body 210. The expansion connector 220 may be configured to permit access to an interior cavity of the expansion pack 200. In one embodiment, the expansion connector 220 may be configured to receive wires associated with at least one relay. The expansion connector 220 may be configured to connect to at least one junction box 300. When connected to a junction box 300, the expansion connector 220 may be configured to receive at least one wire from the junction box 300 as input.

Body 210 may include a design area 230. The design area 230 may be provided at an exterior surface of the expansion pack 200. The design area 230 may be used, for example, to provide information and/or content. In one exemplary embodiment, the design area 230 may form a recessed section relative to an outer surface of the expansion pack 200, or may include an extruded section relative to the outer surface. The design area may optionally include a design 240 in at least a portion thereof. For example, the design 240 may include a logo, a graphic, text, or any other data or information intended to be conveyed.

The expansion pack 200 may include at least one electronic coupler 260. The electronic coupler 260 may be used to form an electrical connection between the expansion pack 200 and at least one external entity (e.g., a main controller 100 or the like). The electronic coupler 260 may include any material or connector capable of forming an electrical connection between expansion pack 200 and the external entity. For example, the electronic coupler 260 may optionally include a Universal Serial Bus (USB) connector or socket, a copper wire cable connector or socket (e.g., a RJ-12 or RJ-45 connector), a metallic contact, or the like, in accordance with the present invention.

In addition or alternative to electronic coupler 260, the expansion pack 200 may include an expansion coupler 270. Expansion coupler 270 may in one embodiment provide a physical coupling mechanism for connecting an expansion pack 200 and at least one external entity (e.g., a main controller 100 or the like). In one embodiment, the expansion coupler 270 may include at least a portion of a latch mechanism, a hook-and-loop mechanism, a key and lock mechanism, or any other physical connection means which enables a physical attachment between an expansion pack 200 and an external entity.

Expansion pack 200 may include at least one knockout 280. Each knockout 280 may be configured to permit an opening to be formed in the body 210 of expansion pack 200 to permit access to a cavity formed within the expansion pack 200. For example, in one exemplary embodiment at least one knockout 280 may be removed from the expansion pack 200 to permit various physical and/or electrical connections to be formed between the expansion pack 200 and an external entity.

Figure 4:
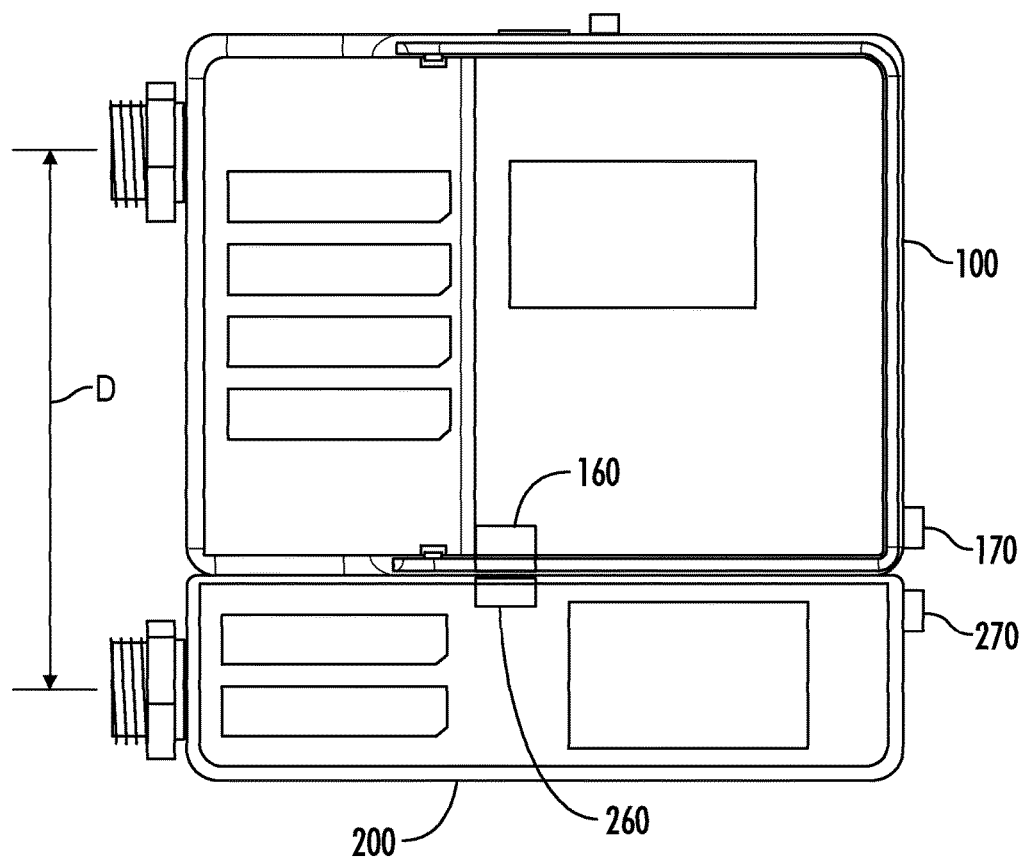
FIG. 4 is a front view of a controller including a main controller and expansion pack according to an exemplary embodiment.

FIG. 4 illustrates an exemplary embodiment in which a main controller 100 is connected to an expansion pack 200. In connecting a main controller 100 and expansion pack 200, the electronic coupler 160 of main controller 100 may be configured to connect to the electronic coupler 260 of expansion pack 200. Similarly, the expansion coupler 170 of main controller 100 may be configured to connect to the expansion coupler 270 of expansion pack 200.

In one embodiment, one or more matching pairs of knockouts 180 and 280 may be respectively provided at the main controller 100 and expansion pack 200 to permit access therebetween. For example, in one embodiment, a matching pair of knockouts 180 and 280 may permit electrical wires to be passed between the main controller 100 and expansion pack 200. Alternatively, main controller 100 and expansion pack 200 may be physically or electronically separate for use, for example, in a location where various electrical wiring and/or component configurations associated with the main controller 100 and expansion pack 200 are mandated by rule or law. In another embodiment, main controller 100 and expansion pack 200 may be physically separated, while an electrical and/or data connection may exist between them via the electrical couplers 160 and 260.

In one exemplary embodiment, a size of the main controller 100, expansion pack 200, main connector 120, and/or expansion connector 220 may be sized or located such that a predetermined distance D is associated between the main connector 120 and expansion connector 220. Alternatively or in addition to the predetermined distance between the main connector 120 and expansion connector 220, a predetermined distance D may be associated with a distance between two main connectors 120, two expansion connectors 220, a junction box 300 and one or more main connectors 120 or expansion connectors 220, or between at least two junction boxes 300, without departing from the spirit and scope of the present invention.

The predetermined distance D may vary based upon a particular implementation or may be standardized in a number of ways. For example, the predetermined distance D may be determined based on a size, shape, configuration, or characteristic of a main controller 100, main connector 120, expansion pack 200, expansion connector 220, junction box 300, or any combination thereof. In one exemplary embodiment, a predetermined distance D may be associated with an overall size of a main controller 100 based on a number of electrical relays housed therein. For example, a main controller 100 having eight electrical relays housed therein may have a larger associated predetermined distance D than a main controller 100 having four electrical relays housed therein. Similarly, a predetermined distance D associated with an expansion pack 200 may vary based on a number of electrical relays housed therein. In one embodiment, each main controller 100, expansion pack 200, and/or junction box 300 may have an associated predetermined distance D. One or more predetermined distances D may be summed to arrive at a total predetermined distance D for a particular installation. However, the present invention is not limited to a summation of predetermined distances D, and any measurement or knowledge of characteristics of the main controller 100, expansion pack 200, junction box 300, or any operational characteristic may be used without departing from the spirit and the scope of the present invention.

By establishing a predetermined distance D, the present invention may permit eased rough-in installation while reducing costs relative to existing controllers. For example, a classroom installation may require four electrical relays within a main controller 100. Additionally, local law may require a second, isolated, relay box for emergency lighting. In this scenario, a four-relay main controller 100 may be selected along with a two-relay expansion pack 200. During rough-in, a contractor may receive instructions to install a predetermined number of junction boxes 300 based on a predetermined relay configuration having a predetermined number of main controllers 100 and/or expansion packs 200. In this scenario, the predetermined number of junction boxes 300 may be installed so as to correspond to the predetermined distance D between connectors associated with one or more main controllers 100 and/or one or more expansion packs 200. Permitting rough-in corresponding to a configuration having a predetermined number of junction boxes 300 and at least one predetermined distance D, reduced installation time based on ease of installation while cost is reduced by providing only the controller(s) and/or expansion pack(s) required by a particular installation.

FIG. 5 illustrates an exemplary configuration having three junction boxes according to an aspect of the present invention. As shown in FIG. 5, three junction boxes 300 may be connected to one another. In one embodiment, each junction box 300 may include one or more junction inputs 310 configured to permit entry to an inner cavity of a junction box 300. In one embodiment, one or more junction inputs 310 may include a knockout or other opening means to permit suitability for a particular installation location or configuration.

One or more input wires 301 may exist within the cavity of a junction box 300. The one or more input wires 301 may be configured to attach to one or more control wires 302. In one embodiment, an input wire 301 may connect to a control wire 302 by means of a connector 305. The connector 305 may include, for example, a winged or twisted wire connector, electrical tape, or any other means of connecting an input wire 301 to a control wire 302.

At least a portion of a control wire 302 may exit a junction box 300 through an opening 320. In one embodiment, the opening 320 may be configured to correspond to a main connector 120 of a main controller 100, as illustrated in FIG. 5. Similarly, the opening 320 may be configured to correspond to an expansion connector 220 of an expansion pack 200. In one embodiment, one or more control openings 320 may include a knockout or other opening means to permit suitability for a particular installation location or configuration.

Connecting a junction box 300 to a main controller 100 or expansion pack 200 may include positioning an opening 320 of a junction box 300 to receive at least a portion of a main connector 120 or expansion connector 220. Once a portion of the main connector 120 or expansion connector 220 is within a cavity of the junction box 300, a fastener such as a nut or other attachment means may be used to secure the junction box 300 to the main controller 100 or expansion pack 200. Although illustrated in FIG. 5 as connecting only one junction box 300 to a main controller 100, one or more junction boxes 300 may be connected to one another and/or one or more junction boxes 300 may be connected to a single main controller 100 or expansion pack 200 without departing from the spirit and scope of the present invention.

A junction box 300 according to one exemplary embodiment may be configured to mount to a wall or mounting surface. Either alternatively or in addition to surface mounting, each junction box 300 may be configured to attach to one or more junction box 300, main controller 100, and/or expansion pack 200.

In one embodiment, one or more junction boxes 300 may be determined to be required by a particular installation in accordance with the previous invention. At time of installation, each of the one or more junction boxes 300 may be installed so as to satisfy the predetermined distance D. In one exemplary embodiment, the predetermined distance D may correspond to a distance equivalent to a spacing between openings 320 of at least two junction boxes 300 when placed in direct contact or otherwise connected to one another. For example, two junction boxes 300 may be directly attached to one another and a distance between openings 320 of the two junction boxes 300 may correspond to the predetermined distance D. In this embodiment, knockouts at each junction box 300 may be opened so as to permit wiring to pass between the two junction boxes 300.

In another embodiment, two junction boxes 300 may be connected to one another using a coupler 330. Coupler 330 may include, for example, a conduit, a nipple, or any other connection means configured to interconnect at least two junction boxes 300 while permitting wiring to pass between the two junction boxes 300. A size, length, and/or characteristic of the coupler 330 may be selected or determined to corresponding to the predetermined distance D in one embodiment. For example, a coupler 330 may be selected in one embodiment to create a distance between openings 320 of at least two junction boxes which correspond to the predetermined distance D. One or more fasteners as known in the art may be used to connect the coupler 330 to at least one junction box 300. Alternatively, at least one junction box 300 may include at least a portion of a fastening means associated with a coupler 330.

Figure 6:
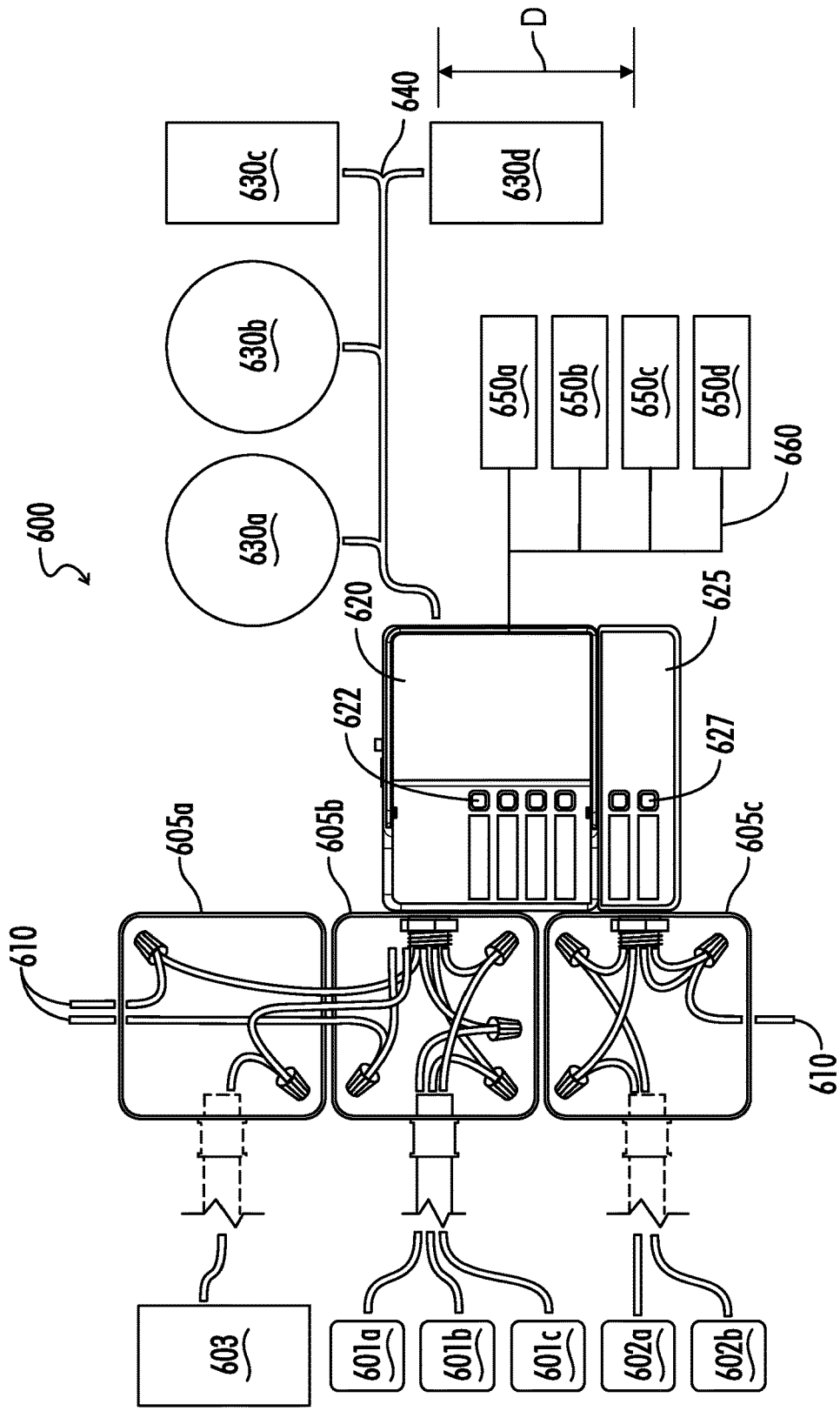
FIG. 6 is a front view of an exemplary implementation having a main controller, an expansion pack, and three junction boxes, according to an exemplary embodiment.

An exemplary implementation in accordance with the present invention is illustrated with reference to FIG. 6. FIG. 6 illustrates a control network 600 having a main controller 620 connected to an expansion pack 625 connected to three junction boxes 605a-c. The main controller 620 and expansion pack 625 may be used to control loads 601a-c, emergency loads 602a-b, and power receptacle 603. A predetermined distance D may be associated with at least one of the main controller 620, expansion pack 625, and/or junction boxes 605a-c in accordance with the previous invention. At least one external input 610 may be configured to be received by at least one junction box 300 to provide power to various components of the control network 600. The at least one external input 610 may, in one embodiment, additionally permit control signals and/or operational communications to be provided to the control network 600, without departing from the spirit and scope of the present invention. The main controller 620 may include at least one button 622. The main controller 620 may include at least one button 622, each button 622 being associated with at least one circuit wire. In one embodiment, each button 622 may permit circuit testing of the at least one associated circuit wire configuration. Similarly, expansion pack 625 may, in one embodiment, include at least one button 627, which may be configured to permit circuit testing of at least one associated circuit wiring configuration.

In the exemplary embodiment illustrated by FIG. 6, various devices 630a-d may be operably connected to the main controller 620 by means of bus 640. The devices 630a-d may each include a control means capable of determining or receiving an input to convey an operational setting of the control network 600. For example, each of devices 630a-d may include a daylight sensor, an occupancy sensor, a wall switch, or any other means of determining or receiving an input relating to the control network 600. The devices 630a-d may be connected to a main controller 100 and/or expansion pack 200 via the bus 640. In one embodiment, the bus 640 may include a no polarity two wire control wiring. However, any means of conveying electrical signals and/or power between at least one device 630 and another device 630, main controller 100, or expansion pack 200 may be used as a bus 640 without departing from the spirit and scope of the present invention. In one embodiment, the bus 640 may include a multi-conductor 18 gauge AWG Cable. In one embodiment, bus 640, either in place of or in addition to a physical medium, may be implemented using wireless communications. For example, each of the devices 630a-d, main controller 100, and/or expansion pack 200 may communicate with one another using wireless communications. In one exemplary embodiment, wireless communication may be used to provide redundancy of communications and/or failover support. In another embodiment, each of devices may communicate with one or more users via wired or wireless communications, for example, to permit a user to provide a command input or otherwise modify an operational characteristic of the control network 600.

One or more dimming zones 650a-d may be associated with a main controller 100 or expansion pack 200, either alone or in combination. Each dimming zone 650 may be associated with one or more light sources, and may be configured to permit grouping one or more light sources together as a dimming zone for control purposes. For example, in one embodiment, a dimming zone 650a may be associated with four light sources, wherein an operational characteristic of each of the four light sources may be modified based on its status as a member of the dimming zone 650a (e.g., each of the four light sources may be dimmed at a same or similar output level responsive to a command associated with dimming zone 650a). Each dimming zone 650 may be associated with one or more devices either within a single physical space or spanning a plurality of physical spaces within the scope of the present invention. The one or more dimming zones 650a-d may be operably connected to at least one of the main controller 100 and expansion box 200 via a bus 660. In one embodiment, the bus 660 may be implemented as a bus 640, however, any means of conveying electrical or control signals associated with the dimming zones 650a-d may be used within the scope of the present invention. Additionally, bus 660 may be implemented using wireless communications.

In one exemplary embodiment, each dimming zone 650 may correspond to a 0-Volt dimming zone. In one embodiment, load(s) corresponding to each dimming zone 650 may be configured to operate based upon a dimming zone voltage associated with the load(s).

Figure 7A:
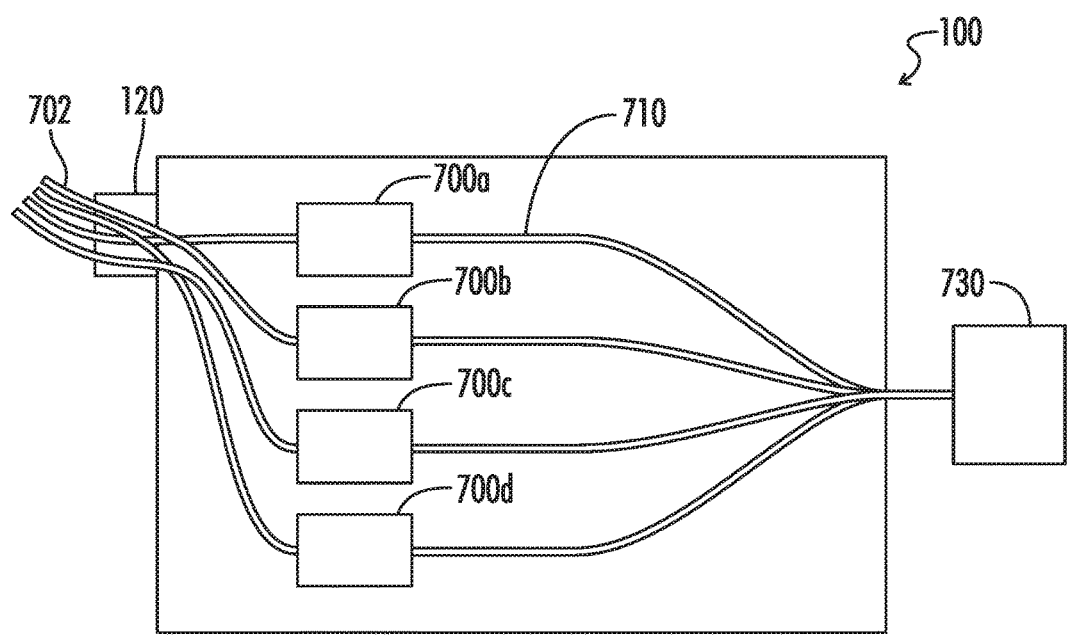
FIGS. 7A-B respectively illustrate internal views of the main controller and expansion pack according to an exemplary embodiment.
Figure 7B:
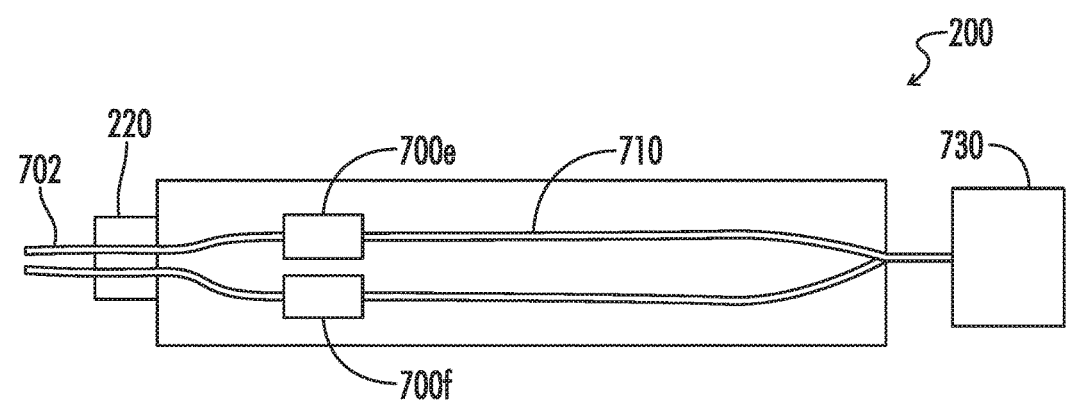

FIGS. 7A-B respectively illustrate exemplary configurations of the main controller 100 and expansion pack 200 according to an aspect of the present invention. As illustrated in FIG. 7A, a main controller 100 may comprise one or more relays 700. Although FIG. 7A illustrates the main controller 100 comprising four relays 700a-d, any number of relays 700 may be housed within a main controller 100 within the spirit and scope of the present disclosure. In one embodiment, a number of relays 700 associated with a main controller 100 may be configured to correspond to a predetermined or conventional number of required or desired connections for a given wiring or room configuration. For example, in one embodiment a main controller 100 may comprise a total of four relays 700a-d to satisfy a majority of room configurations, whereas an alternative main controller 100 design may comprise five or more relays 700. The main controller 100 may also comprise fewer than four relays 700. Accordingly, a main controller 100 may comprise any number of relays 700 within the scope of the present disclosure.

Each relay 700 may be connected to at least one control wire 702. In one embodiment, one or more control wires 702 may correspond to control wire 302 as described herein. At least one control wire 702 may be configured to exit the main controller 100 at the main connector 120, however one or more control wires 702 may be configured to be housed within the main controller 100 or to exit the main controller 100 at an alternative opening therein. The relay 700 may additionally connect to at least one relay wire 710. In one embodiment, one or more control wires 702 and/or one or more relay wires 710 may be used to convey control signals, power, and/or any other information either as input or output to at least one corresponding relay 700. The one or more relay wires 710 may, in one embodiment, comprise either wired or wireless interconnection means. The one or more relay wires 710 may be connected to the main controller 100 at one end and one or more external device(s) 730 at an opposite end, for example in order to provide input or output control signaling, power, and/or input communications between the main controller 100 and at least one of the one or more external devices 730. The one or more external device(s) 730 may comprise at least one of a sensor, switch, input, load, or other device capable of transmitting or receiving control information, transmitting or receiving power, or transmitting or receiving other information within the scope of the present disclosure.

FIG. 7B illustrates an exemplary configuration of an expansion pack 200 according to an aspect of the present invention. In one embodiment, the expansion pack 200 may comprise at least one relay 700. Although illustrated in FIG. 7B as containing two relays 700*e-f*, the expansion pack 200 may comprise any number of relays 700 within the scope of the present disclosure, in a similar manner as described herein in relation to main controller 100.

As described above with reference to main controller 100, each relay 700 may be connected to at least one control wire 702. In one embodiment, one or more control wires 702 may correspond to control wire 302 as described herein. At least one control wire 702 may be configured to exit the expansion pack 200 at an expansion connector 220, however one or more control wires 702 may be configured to be housed within the expansion pack 200 or to exit the expansion pack at an alternative opening therein. The relay 700 may additionally connect to at least one relay wire 710. In one embodiment, one or more control wires 702 and/or one or more relay wires 710 may be used to convey control signals, power, and/or any other information either as input or output to at least one corresponding relay 700. The one or more relay wires 710 may, in one embodiment, comprise either wired or wireless interconnection means. The one or more relay wires 710 may be connected to the expansion pack at one end and one or more external devices at an opposite end, for example in order to provide input or output control signaling, power, and/or input communications between the expansion pack and at least one of the one or more external devices.

In operation, various aspects of the present disclosure may enable a method for coordinating installation of a combined main lighting controller and expansion pack described herein at a plurality of junction boxes. The method may begin by determining a required or desired number of electrical components corresponding to a particular installation. In one embodiment, the electrical components may be electrical relays, however any electrical component or set of components fall within the spirit and scope of the present disclosure. A main lighting controller and at least one expansion pack may be combined to satisfy the desired or required number of electrical components. A desired or required number of junction boxes for a particular installation may be determined. A corresponding number of junction boxes may be connected to one another to form an array. A spacing between junction boxes may be determined such that a knockout associated with at least one of the junction boxes may correspond to an opening associated with an external device such as a main controller, expansion pack, another junction box, or any combination thereof. The junction boxes may be connected to the main controller and expansion pack in accordance with the determined spacing.

In one exemplary embodiment, the junction boxes may be connected to form an array at a first installation time such as during rough in. The junction boxed may later be connected to a main lighting controller, an expansion pack, and/or one or more junction boxes at a second, later installation time. By performing a method in accordance with the present disclosure, the predetermined number of electrical components and spacing may be used by an installer to simplify rough in and the installation process as a whole. For example, an electrician provided with the number of electrical components and spacing may wire a room and mount a junction box array in a manner so as to allow a later installer to merely connect a combined main controller 100 and expansion pack 200 to the pre-installed array.

In one embodiment, determining the spacing between at least two junction boxes may comprise determining that at least two junction boxes should be directly connected to one another. In another embodiment, the determined spacing may comprise a distance which may be configurable, for example by use of a coupler 330 as previous described.

To facilitate the understanding of the embodiments described herein, a number of terms are defined below. The terms defined herein have meanings as commonly understood by a person of ordinary skill in the areas relevant to the present invention. Terms such as "a," "an," and "the" are not intended to refer to only a singular entity, but rather include the general class of which a specific example may be used for illustration. The terminology herein is used to describe specific embodiments of the invention, but their usage does not delimit the invention, except as set forth in the claims. The phrase "in one embodiment," as used herein does not necessarily refer to the same embodiment, although it may.

The term "circuit" means at least either a single component or a multiplicity of components, either active and/or passive, that are coupled together to provide a desired function. Terms such as "wire," "wiring," "line," "signal," "conductor," and "bus" may be used to refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The previous detailed description has been provided for the purposes of illustration and description. Thus, although there have been described particular embodiments of a new and useful invention, it is not intended that such references be construed as limitations upon the scope of this invention except as set forth in the following claims.

What is claimed is:

1. A lighting control system, comprising:
an expansion pack;
a main lighting controller comprising
at least one electrical relay,
a main connector having an opening permitting access to an interior portion of the main lighting controller, and
a main coupler directly connected to the expansion pack;
the expansion pack comprising
at least one electrical relay,
an expansion connector having an opening permitting access to an interior portion of the expansion pack, and
an expansion coupler directly connected to the main lighting controller;
at least two junction boxes each comprising at least one configurable opening adapted to permit access to an interior portion of the junction box, a first of the at least two junction boxes directly connected to the main lighting controller and a second of the at least two junction boxes directly connected to the expansion pack;
wherein a location of the main connector and a location of the expansion connector form a predetermined distance therebetween when the main lighting controller and the expansion pack are connected via the main coupler and the expansion coupler, and
wherein the at least one configurable opening of each of the first of the at least two junction boxes and the second of the at least two junction boxes corresponds to the predetermined distance.

2. The lighting control system of claim 1, wherein the main lighting controller includes four electrical relays.

3. The lighting control system of claim 1, wherein the expansion pack comprises two electrical relays.

4. The lighting control system of claim 1, wherein the expansion pack is connected to the main lighting controller based on a predetermined number of electrical relays associated with the lighting control system.

5. The lighting control system of claim 1, wherein a distance between the at least one configurable opening of each of the at least two junction boxes corresponds to the predetermined distance when the at least two junction boxes are connected to one another.

6. The lighting control system of claim 1, wherein a distance between the at least one configurable opening of each of the at least two junction boxes corresponds to the predetermined distance based on an installation distance between the at least two junction boxes.

7. The lighting control system of claim 6, wherein the distance between the at least one configurable opening of each of the at least two junction boxes is adjustable based on a characteristic of a coupler used to connect the at least two junction boxes.

8. The lighting control system of claim 1, wherein an output of the main lighting controller controls a dimming level associated with at least one load of the lighting control system.

9. The lighting control system of claim 1, wherein the main lighting control outputs a dimming voltage associated with a predetermined dimming level for at least one load of the lighting control system.

10. The lighting control system of claim 9, wherein the dimming voltage is between 0-10 volts.

11. The lighting control system of claim 1 further comprising at least one external control device communicatively coupled to the main lighting controller, wherein the main lighting controller controls at least one load based on a signal received from the at least one external control device.

12. An expansion pack configured to connect to a main lighting controller and a junction box of a lighting control system, the expansion pack comprising:
at least one electrical relay;
an expansion connector having an opening permitting access to an interior portion of the expansion pack; and
an expansion coupler directly connectable to the main lighting controller,
wherein a location of the expansion connector forms a predetermined distance from a main connector of the main lighting controller when the expansion pack is connected to the main lighting controller, and
wherein the expansion pack directly connects to the junction box while also being directly connected to the main lighting controller, in accordance with the predetermined distance.

13. The expansion pack of claim 12, wherein the expansion pack is connected to the main lighting controller based on a predetermined number of electrical relays associated with the lighting control system.

14. The expansion pack of claim 12, wherein a distance between the at least one configurable opening of each of the at least two junction boxes corresponds to the predetermined distance when the at least two junction boxes are connected to one another.

15. The expansion pack of claim 12, wherein the expansion pack further comprises an electronic coupler connected to the main lighting controller and forming an electrical connection between the expansion pack and the main lighting controller.

16. The expansion pack of claim 12, wherein the expansion pack isolates electrical components within the expansion pack from electrical components within the main lighting controller.

17. The lighting control system of claim 1, wherein the at least one configurable opening is a knockout.

18. The lighting control system of claim 17, wherein the predetermined distance corresponds to a gap between the knockout of the first of the at least two junction boxes and the knockout of the second of the at least two junction boxes.

19. The lighting control system of claim 1, where at least one of the first of the at least two junction boxes and the second of the at least two junction boxes comprises an input section for receiving at least one external power input, the at least one of the first of the at least two junction boxes and the second of the at least two junction boxes containing at the interior portion the at least one external power input and at least one load input separate from the at least one external power input.

* * * * *